US012761548B2

(12) United States Patent
Oh et al.

(10) Patent No.: US 12,761,548 B2
(45) Date of Patent: Oct. 13, 2026

(54) METHOD OF MANUFACTURING PHOTOMASK, AND METHOD OF MANUFACTURING SEMICONDUCTOR DEVICE USING THE SAME

(71) Applicant: SAMSUNG ELECTRONICS CO., LTD., Suwon-si (KR)

(72) Inventors: Jongkeun Oh, Suwon-si (KR); Yongwoo Kim, Suwon-si (KR); Suzy Roh, Suwon-si (KR); Jongju Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 684 days.

(21) Appl. No.: 18/328,395

(22) Filed: Jun. 2, 2023

(65) Prior Publication Data

US 2023/0408912 A1 Dec. 21, 2023

(30) Foreign Application Priority Data

Jun. 8, 2022 (KR) ........................ 10-2022-0069205

(51) Int. Cl.

*G03F 1/74* (2012.01)
*G03F 1/24* (2012.01)
*H10P 76/20* (2026.01)

(52) U.S. Cl.

CPC .................. *G03F 1/74* (2013.01); *G03F 1/24* (2013.01); *H10P 76/2041* (2026.01)

(58) Field of Classification Search

CPC ..... G03F 1/74; G03F 1/24; G03F 1/72; G03F 1/80; G03F 7/70116

See application file for complete search history.

(56) References Cited

U.S. PATENT DOCUMENTS

| | | | |
|---|---|---|---|
| 8,741,067 B2 | 6/2014 | Leclaire et al. | |
| 9,335,206 B2 | 5/2016 | Zhang et al. | |
| 9,494,854 B2 | 11/2016 | Satake et al. | |
| 2002/0014403 A1 | 2/2002 | Hoshino | |
| 2003/0000921 A1 | 1/2003 | Liang et al. | |
| 2008/0011718 A1 | 1/2008 | Koops et al. | |
| 2022/0113619 A1 | 4/2022 | Oh et al. | |
| 2022/0283512 A1* | 9/2022 | Park .................... | G03F 7/70625 |

FOREIGN PATENT DOCUMENTS

| | | |
|---|---|---|
| KR | 10-2007-0118095 A | 12/2007 |
| KR | 10-2022-0049651 A | 4/2022 |

* cited by examiner

*Primary Examiner* — Stewart A Fraser

(74) *Attorney, Agent, or Firm* — Wolf, Greenfield & Sacks, P.C.

(57) ABSTRACT

A method of manufacturing a photomask includes forming a photomask having a plurality of pattern elements, wherein the plurality of pattern elements include correction-target pattern elements having a critical dimension (CD) deviation; acquiring local CD correction information; directing a laser beam to a mirror array of a digital micromirror device (DMD), wherein the mirror array has mirrors arranged in a plurality of rows and a plurality of columns; converting the laser beam into a beam pattern array corresponding to the mirror array by controlling on/off switching of each of the mirrors based on the local CD correction information; forming a linear beam by focusing the beam pattern array through an optical system; applying an etchant to the photomask and directing the linear beam to the photomask and moving the linear beam to irradiate the photomask.

20 Claims, 15 Drawing Sheets

METHOD OF MANUFACTURING PHOTOMASK, AND METHOD OF MANUFACTURING SEMICONDUCTOR DEVICE USING THE SAME

CROSS-REFERENCE TO RELATED APPLICATION(S)

This application claims benefit of priority to Korean Patent Application No. 10-2022-0069205 filed on Jun. 8, 2022 in the Korean Intellectual Property Office, the disclosure of which is incorporated herein by reference in its entirety.

BACKGROUND

The present inventive concept relates to a method of manufacturing an extreme ultraviolet (EUV) photomask, and more particularly, to a method of manufacturing a photomask, including a local correction process of a critical dimension (CD) of an EUV photomask, and a method of manufacturing a semiconductor device.

With the increasing high degree of integration and miniaturization of semiconductor devices, a technique for forming circuit patterns for semiconductor devices to have a smaller size may be required. In order to meet these technical requirements, light sources used in a photolithography process may be required to emit shorter wavelengths of light.

Recently, an EUV photolithography process using an extreme ultraviolet ray as a light source has been proposed. Since EUV is absorbed by most refractive optical materials, the EUV photolithography process generally uses an EUV photomask employing a reflective optical system, rather than a refractive optical system.

When a defect (e.g., CD deviation) occurs in the photomask, the EUV may be transferred to a wafer. Accordingly, a technique for effectively correcting defects of the photomask may be required.

SUMMARY

An aspect of the present inventive concept is to provide a method of manufacturing a photomask, capable of efficiently performing critical dimension correction in a local region. An aspect of the present inventive concept is to provide a method of manufacturing a semiconductor device, capable of efficiently performing critical dimension correction in a local region of a photomask.

According to an aspect of the present inventive concept, a method of manufacturing a photomask includes forming a photomask having a plurality of pattern elements, wherein the plurality of pattern elements include correction-target pattern elements having a critical dimension (CD) deviation from a target CD; acquiring local CD correction information including position and CD deviations of the correction-target pattern elements in the photomask; directing a laser beam to a mirror array of a digital micromirror device (DMD), wherein the mirror array has mirrors arranged in a plurality of rows and a plurality of columns; converting the laser beam into a beam pattern array corresponding to the mirror array by controlling on/off switching of each of the mirrors based on the local CD correction information, wherein the beam pattern array has a beam pattern arranged in a position corresponding to on-state mirrors in the mirror array; forming a linear beam by focusing the beam pattern array through an optical system; and performing CD correction of an area of the photomask by applying an etchant to the photomask, directing the linear beam to the photomask, and moving the linear beam to irradiate the area.

According to an aspect of the present inventive concept, a method of manufacturing a photomask includes preparing a mask blank including a substrate, a reflective layer on the substrate, and a light absorbing layer on the reflective layer, wherein the reflective layer is configured to reflect extreme ultraviolet (EUV) light; etching the light absorbing layer to form a photomask having a plurality of pattern elements, wherein the plurality of pattern elements include correction-target pattern elements having a critical dimension (CD) deviation from a target CD; identifying a correction-target region in which the correction-target pattern elements are located in the photomask, and acquiring local CD correction information including position and CD deviations of the correction-target pattern elements; directing a laser beam to a mirror array of a digital micromirror device (DMD), wherein the mirror array has mirrors arranged in a plurality of rows and a plurality of columns; converting the laser beam into a beam pattern array corresponding to the mirror array by controlling on/off switching of each of the mirrors based on the local CD correction information, wherein the beam pattern array has a beam pattern arranged in a position corresponding to on-state mirrors in the mirror array; forming a linear beam by focusing the beam pattern array through an optical system; and performing CD correction of the photomask by applying a chemical liquid to the photomask and scanning the linear beam over the photomask to irradiate the photomask.

According to an aspect of the present inventive concept, a method of manufacturing a semiconductor device includes forming a photoresist film on a wafer having a feature layer; preparing a photomask including a substrate, a reflective layer on the substrate, and a light absorbing layer on the reflective layer, wherein the reflective layer is configured to reflect extreme ultraviolet (EUV) light, and wherein the light absorbing layer includes a plurality of pattern elements, wherein the plurality of pattern elements include correction-target pattern elements having a critical dimension (CD) deviation from a target CD; correcting critical dimensions of the correction-target pattern elements by applying a chemical liquid to the photomask and irradiating a region in which the correction-target pattern elements are located with a laser beam resulting in a corrected photomask; forming a photoresist pattern by exposing and developing the photoresist layer using the corrected photomask; and processing the feature layer using the photoresist pattern, wherein the correcting of the critical dimensions of the correction-target pattern elements includes acquiring local CD correction information including position and CD deviations of the correction-target pattern elements in the photomask; directing a laser beam to a mirror array of a digital micromirror device (DMD), wherein the mirror array has mirrors arranged in a plurality of rows and a plurality of columns; converting the laser beam into a beam pattern array corresponding to the mirror array by controlling on/off switching of the mirrors in the mirror array based on the local CD correction information; forming a linear beam by focusing the beam pattern array through an optical system; and performing CD correction over a desired area of the photomask by applying an etchant to the photomask and scanning the linear beam over the photomask to irradiate the photomask.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, specific embodiments of the present inventive concept will be described in detail with reference to the accompanying drawings.

Figure 1:
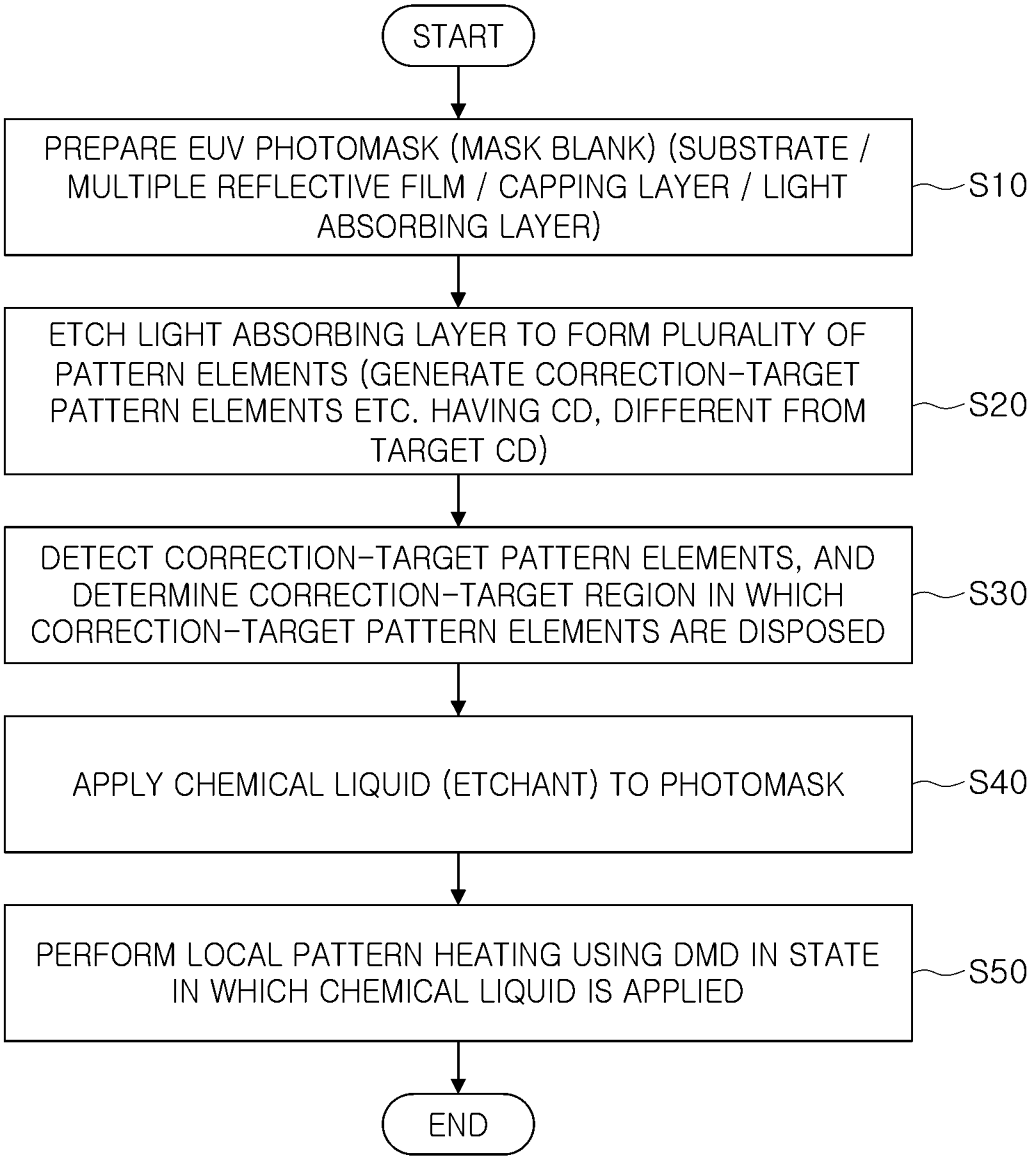
FIG. 1 is a process flow diagram illustrating a method of manufacturing an extreme ultraviolet (EUV) photomask according to an embodiment.
Figure 2:
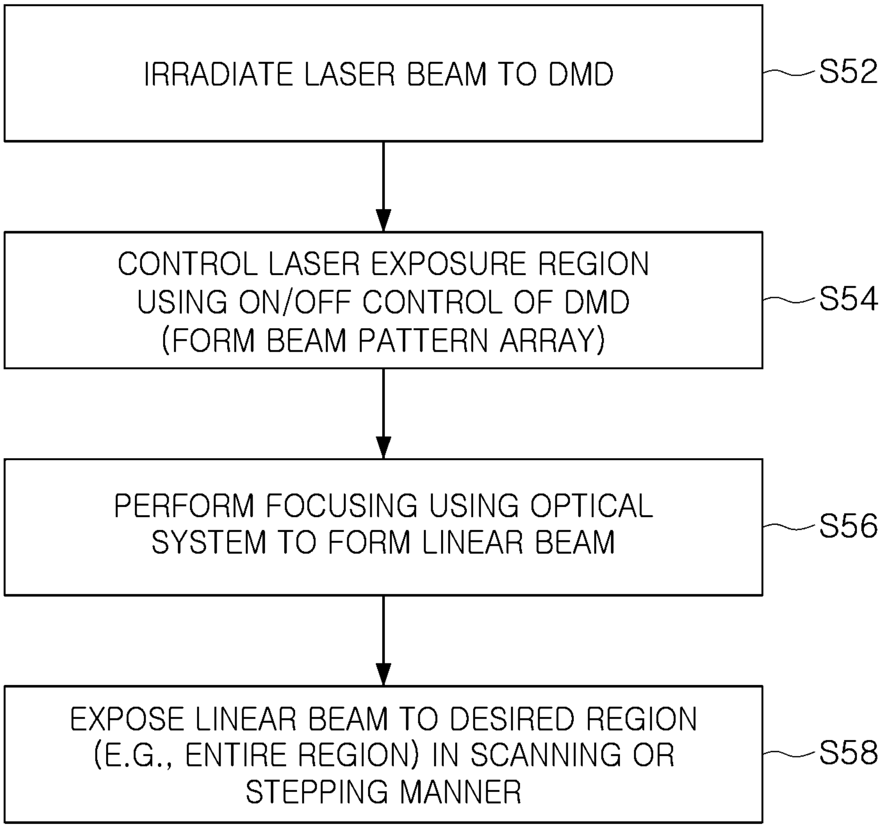
FIG. 2 is a process flow diagram illustrating photomask correction using local pattern heating employed in an embodiment.

FIG. 1 is a process flow diagram illustrating a method of manufacturing an extreme ultraviolet (EUV) photomask according to an embodiment, and FIG. 2 is a process flow diagram illustrating a local pattern heating process during the process of FIG. 1.

First, referring to FIG. 1, a method of manufacturing a photomask according to the present embodiment may start with preparing a mask blank (S10). An example of a mask blank 100' introduced in S10 may be illustrated in FIG. 3.

Figure 3:
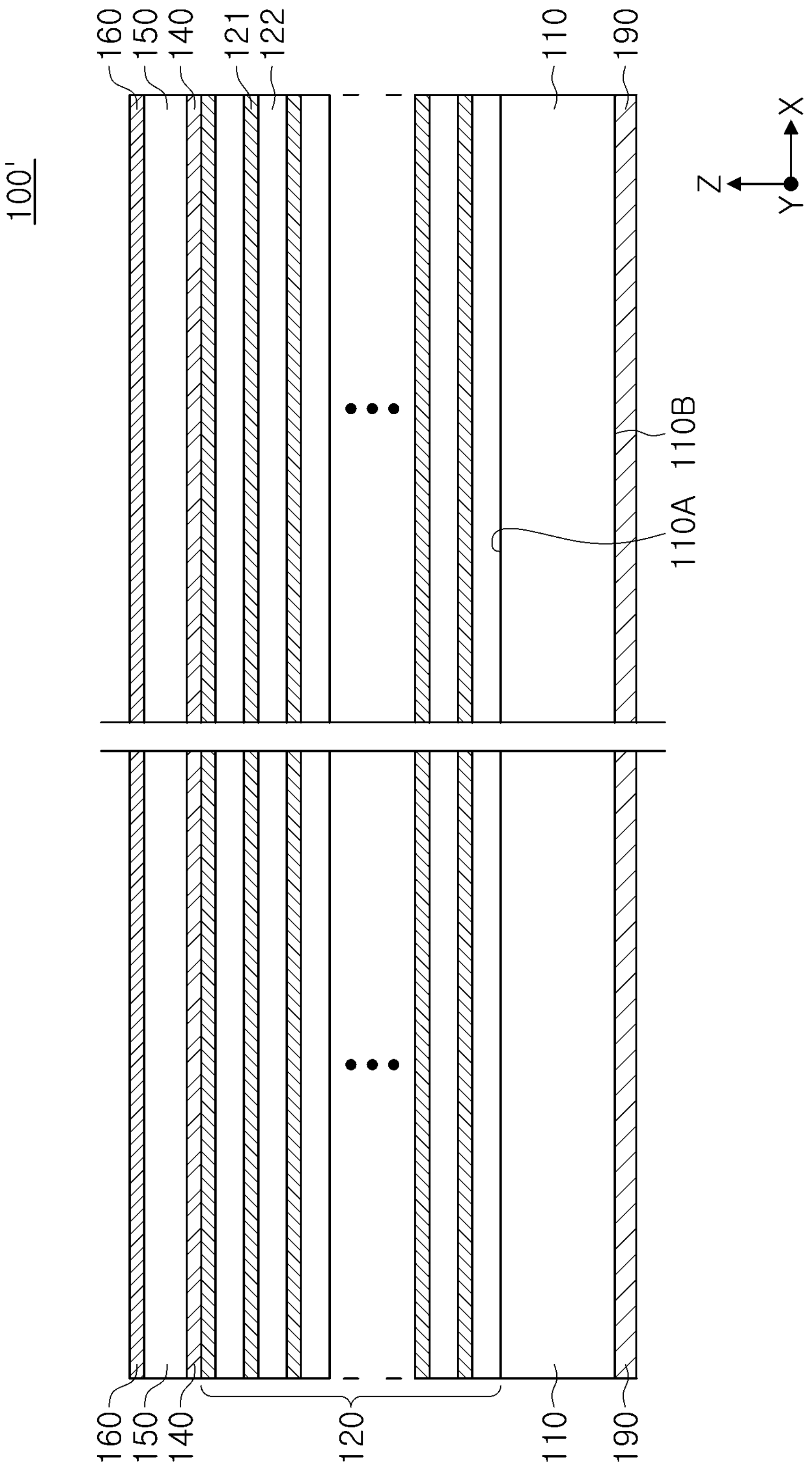
FIG. 3 is a cross-sectional view schematically illustrating an example of an extreme ultraviolet mask blank.

Referring to FIG. 3, a mask blank 100' may include a mask substrate 110, and a reflective layer 120, a capping layer 140, and a light absorbing layer 150, sequentially disposed on a first surface 110A of the mask substrate 110. The mask blank 100' according to the present embodiment may be a mask blank for a reflective photomask.

The mask substrate 110 may include a dielectric, glass, a semiconductor, or a metal material. In some embodiments, the mask substrate 110 may include a material having a low thermal expansion coefficient. For example, the mask substrate 110 may have a thermal expansion coefficient at 20° C. of about $0\pm1.0\times10^{-7}$/° C. In addition, the mask substrate 110 may be formed of a material having excellent smoothness, excellent flatness, and excellent resistance to a cleaning solution.

For example, the mask substrate 110 may be a synthetic quartz glass, a quartz glass, an aluminosilicate glass, a soda lime glass, a low thermal expansion material (LTM) glass such as an $SiO_2$—$TiO_2$-based glass, a crystallized glass acquired by depositing a β-quartz solid solution, monocrystalline silicon, or SiC.

The mask substrate 110 may have a first surface 110A and a second surface 110B, located opposite to each other. In some embodiments, the first surface 110A may have a flatness of about 50 nm or less, and the second surface 110B may have a flatness of about 500 nm or less. For example, the first surface 110A and the second surface 110B of the mask substrate 110 may have a root mean square (RMS) surface roughness of about 0.15 nm or less, respectively, but the present inventive concept is not limited thereto.

The reflective layer 120 may be disposed on the first surface 110A of the mask substrate 110. The reflective layer 120 may be configured to reflect extreme ultraviolet (EUV) light. The reflective layer 120 may include a Bragg reflector in which a first material layer 121 having a high refractive index and a second material layer 122 having a low refractive index are alternately stacked a plurality of times. The first and second material layers 121 and 122 may be repeatedly formed in about 20 to 60 cycles. For example, the reflective layer 120 may include a molybdenum (Mo)/silicon (Si) periodic multilayer film, a Mo compound/Si compound periodic multilayer film, a ruthenium (Ru)/Si periodic multilayer film, a beryllium (Be)/Mo periodic multilayer film, a Si/niobium (Nb) periodic multilayer film, a Si/Mo/Ru periodic multilayer film, a Si/Mo/Ru/Mo periodic multilayer film, or a Si/Ru/Mo/Ru periodic multilayer film.

Materials constituting the first and second material layers 121 and 122 and a film thickness of each of the first and second material layers 121 and 122 may be adjusted according to a wavelength band of applied EUV light, or reflectance of EUV light required by the reflective layer 120. In some embodiments, the reflective layer 120 for an EUV mask blank 100 may include a molybdenum (Mo)/silicon (Si) periodic multilayer film. For example, the first material layer 121 may be formed of molybdenum or silicon, and the second material layer 122 may be formed of silicon or molybdenum.

The reflective layer 120 may be formed using DC sputtering, RF sputtering, or ion beam sputtering, but the present inventive concept is not limited thereto. For example, when forming a Mo/Si periodic multilayer film using ion beam sputtering, usages of a Si target as a target and an argon (Ar) gas as a sputtering gas to deposit a Si film and usages of a Mo target as a target and an Ar gas as a sputtering gas to deposit a Mo film are set as a single cycle, the Si film and the Mo film may be alternately formed.

The capping layer 140 may serve to protect the reflective layer from mechanical damage and/or chemical damage. For example, the capping layer 140 may include ruthenium (Ru) or a ruthenium compound. The ruthenium compound may be composed of a compound including ruthenium (Ru) and at least one selected from the group consisting of niobium (Nb), zirconium (Zr), Mo, yttrium (Y), boron (B), lanthanum (La), or a combination thereof. For example, the capping layer 140 may have a thickness of about 5 to 100 A.

The light absorbing layer 150 may include a material having a very low reflectance with respect to EUV light while absorbing the EUV light. In addition, the light absorbing layer 150 may include a material having excellent chemical resistance. In some embodiments, the light absorbing layer 150 may include a material having a maximum light reflectance of about 5% or less at a wavelength of about 13.5 nm when a ray of a wavelength region of EUV light is irradiated to a surface of the light absorbing layer 150. For example, the light absorbing layer 150 may include TaN, TaHf, TaHfN, TaBSi, TaBSiN, TaB, TaBN, TaSi, TaSiN, TaGe, TaGeN, TaZr, TaZrN, or a combination thereof.

In some embodiments, the light absorbing layer 150 may be a tantalum boron nitride (TaBN) layer or a tantalum boron oxide (TaBO) layer. For example, a sputtering process may be used to form the light absorbing layer 150, but the present inventive concept is not limited thereto. In some embodiments, the light absorbing layer 150 may have a thickness of about 30 to 200 nm.

An anti-reflection film 160 serves to obtain sufficient contrast by providing a relatively low reflectance in a wavelength band of inspection light, for example, a wavelength band of about 190 to 260 nm, during inspection of pattern elements to be manufactured in a subsequent process, For example, the anti-reflection film 160 may include a metal nitride, for example, a transition metal nitride such as titanium nitride or tantalum nitride, or additionally one or more additional components selected from the group consisting of chlorine, fluorine, argon, hydrogen, and oxygen. For example, the anti-reflection layer 160 may be formed by a sputtering process, but the present inventive concept is not limited thereto. For example, the anti-reflection layer 160 may have a thickness of about 5 to 25 nm. In some embodiments, the anti-reflection layer 160 may be formed by treating a surface of the light absorbing layer 150 under an atmosphere containing an additional component or a precursor thereof.

A backside conductive layer 190 may be disposed on the second surface 110B of the mask substrate 110. The backside conductive layer 190 may be used to be fixed to an electrostatic chuck of a lithographic apparatus during a photolithography process. The backside conductive layer 190 may include a chromium (Cr)-containing material or a tantalum (Ta)-containing material, having conductivity. For example, the backside conductive layer 190 may include at least one of Cr, CrN, or TaB. Alternatively, the backside conductive layer 190 may include a metal oxide or a metal nitride, having conductivity. For example, the backside conductive layer 190 may include at least one of titanium nitride (TiN), zirconium nitride (ZrN), hafnium nitride (HfN), ruthenium oxide ($RuO_2$), zinc oxide ($ZnO_2$), or iridium oxide ($IrO_2$).

In some other embodiments, the mask blank 100' may omit or additionally include some components. For example, the anti-reflection layer 160 and/or the capping layer 140 may be omitted. Subsequently, in a process of forming a pattern element (S20), while the light absorbing layer 150 is dry-etched, the mask blank 100' may further include a buffer layer (not illustrated) for protecting the reflective layer 120 from being damaged. The buffer layer may be formed of a material having a very low absorption rate of EUV light.

Subsequently, in S20, the light absorbing layer 150 may be etched to form a photomask 100 having a plurality of pattern elements PE. An example of the photomask 100 provided in S20 may be illustrated in FIGS. 4 and 5A and 5B.

In the present embodiment, the anti-reflection layer 160 may be etched together with the light absorbing layer 150 to form the plurality of pattern elements PE.

Figure 4:
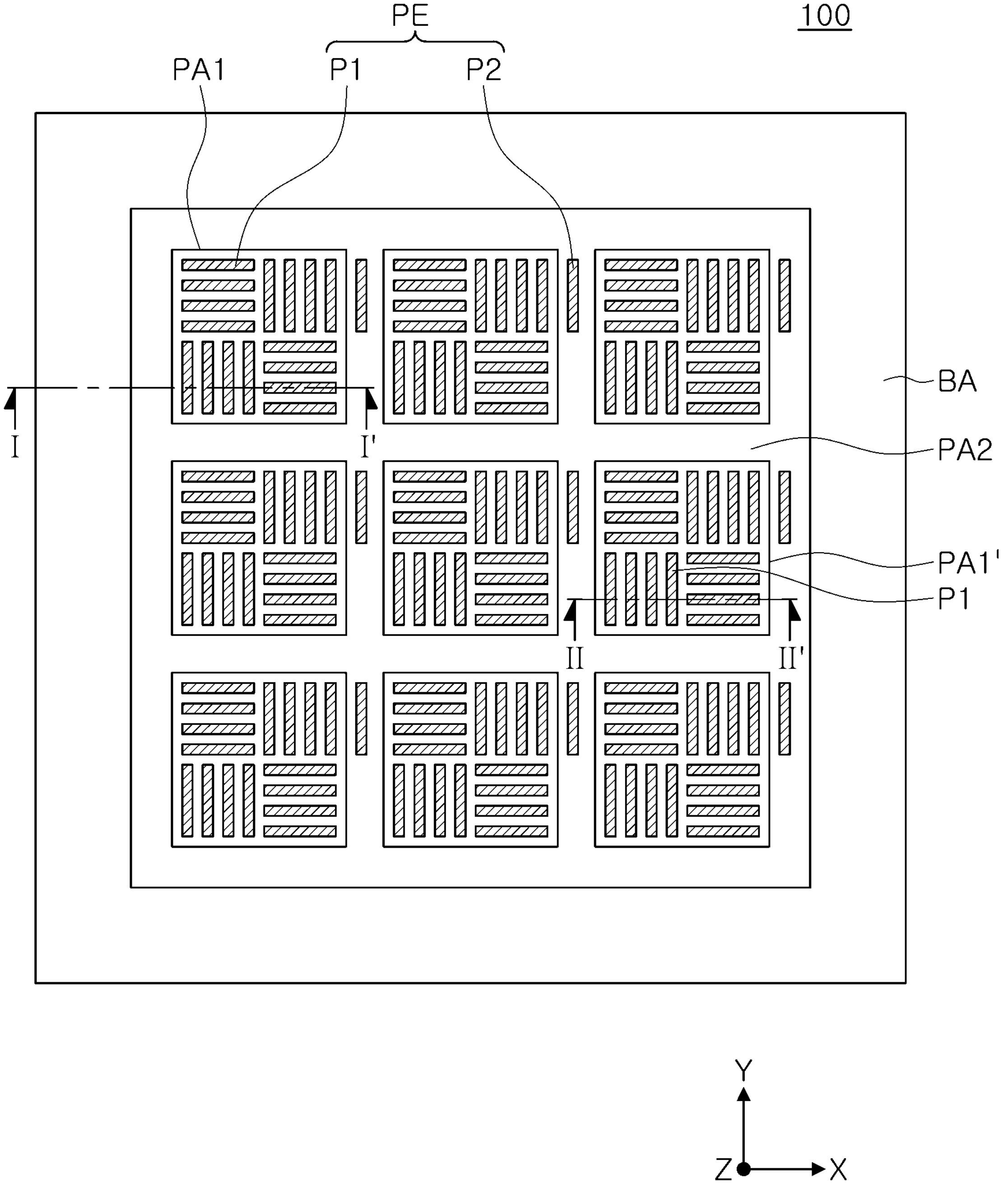
FIG. 4 is a plan view schematically illustrating an extreme ultraviolet photomask before local correction.
Figure 5A:
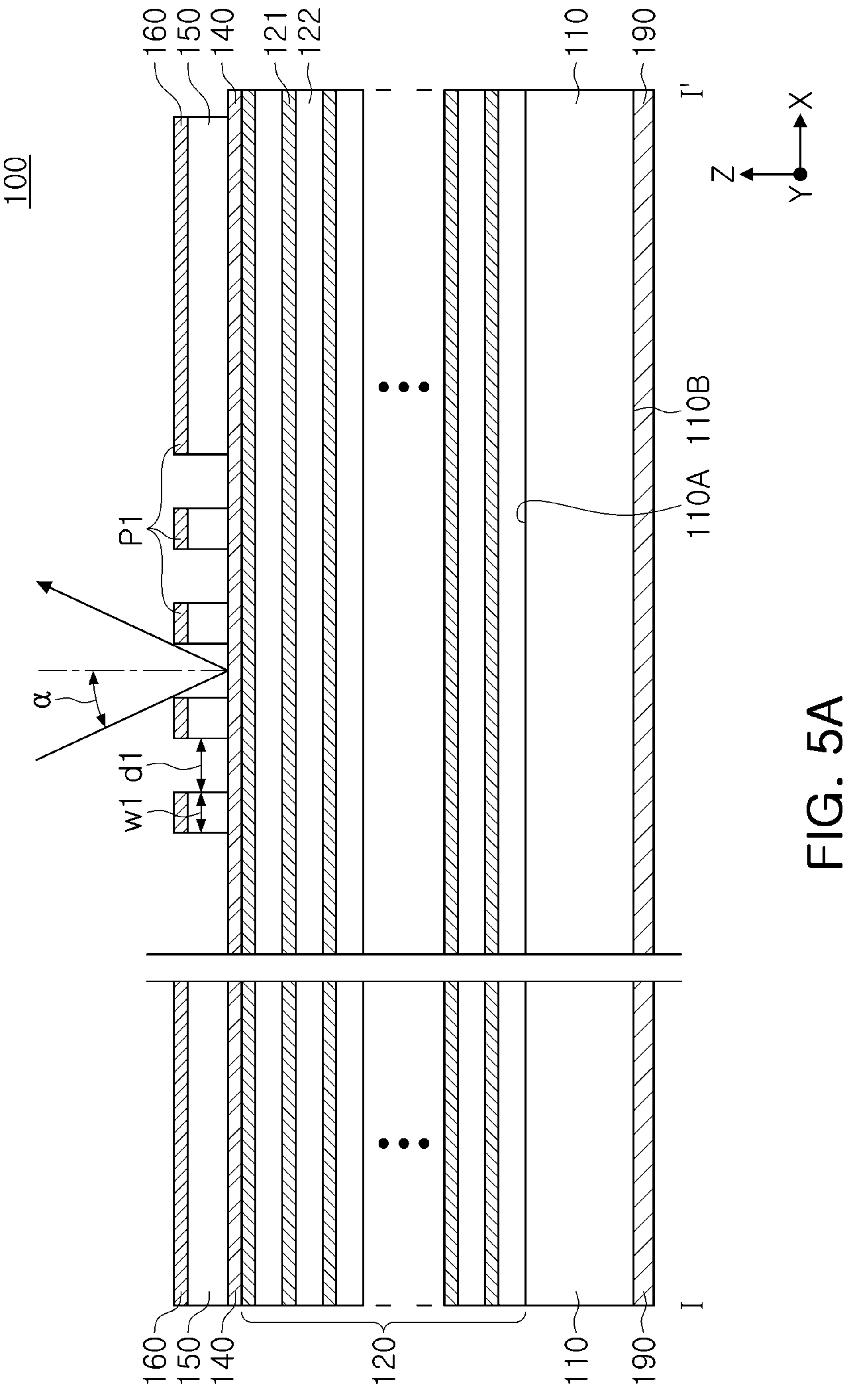
FIGS. 5A and 5B are cross-sectional views of the extreme ultraviolet photomask of FIG. 4, taken along lines I-I' and respectively.

Referring to FIGS. 4 and 5A, the photomask 100 illustrated in the present embodiment may be divided into a pattern region and a non-pattern region. The pattern region of the photomask 100 may include a main pattern region PA1 in which main pattern elements P1 are arranged, and an auxiliary pattern region PA2 in which auxiliary pattern elements P2 are arranged. A border region BA surrounding the main pattern region PA1 and the auxiliary pattern region PA2 may be provided as the non-pattern region.

The plurality of pattern elements PE may include the main pattern elements P1 and the auxiliary pattern elements P2. In an EUV lithography system, the main pattern elements P1 may be elements configured to transfer a pattern for forming unit devices constituting an integrated circuit in a chip region on a wafer, and the auxiliary pattern elements P2 may be elements configured to transfer an auxiliary pattern in a scribe lane region on the wafer. For example, the auxiliary pattern elements P2 may include auxiliary pattern elements (e.g., an align key pattern) that are required in a process of manufacturing an integrated circuit device but do not remain in a final integrated circuit device.

An arrangement illustrated in FIG. 4 is illustrative for convenience of description and illustration, and the photomask employed in the present inventive concept is not limited thereto. In some embodiments, among the plurality of main pattern regions PA1, some main pattern regions PA1 may be non-pattern regions in which the main pattern element P1 is not formed, and some main pattern regions PA1 may include pattern elements, different from other main pattern regions.

In an EUV lithography system, incident light L1 (e.g., an EUV beam) may be projected toward the photomask 100 at an incident angle α with regard to a vertical axis, perpendicular to a surface of the photomask 100. In some embodiments, the incident angle α may range from about 5° to about 7°. The reflected light L2 may be projected toward a projection optical system to perform EUV lithography. In some embodiments, the photomask 100 may be a reflective photomask that may be used in an EUV lithography process using an exposure wavelength in an EUV wavelength range, for example, about 13.5 nm.

The plurality of pattern elements PE may be formed to have a desired target critical dimension. The target critical dimension may be expressed in terms of a line width of pattern elements PE and an interval of adjacent pattern elements. For example, critical dimension uniformity (CDU) in the photomask 100 may determine critical dimension uniformity of patterns implemented on the wafer through a lithography process. In particular, the main pattern elements P1 for the unit devices constituting the integrated circuit may be required to have high uniformity.

The plurality of pattern elements PE may include pattern elements having a critical dimension, different from the target critical dimension, according to distribution of a process set. Some of the pattern elements having different critical dimensions may include correction-target pattern elements.

Next, in S30, the correction-target pattern elements may be detected, and a correction-target region in which the correction-target pattern elements are disposed may be determined. In the present embodiment, additionally, the correction-target pattern elements may extract position and CD deviations (e.g., differences from the target CD) on the photomask.

In the present embodiment, in pattern elements having a critical dimension, different from the target critical dimension, among the plurality of pattern elements PE, (particularly, the main pattern elements P1), pattern elements outside of an allowable range according to a deviation of the critical dimension may be determined as "correction-target pattern elements P1'." The correction-target pattern elements P1' may be distributed in local regions of the photomask 100. Also, the correction-target pattern elements P1' may have different distributions according to processes, and may have different distributions for each photomask.

Figure 5B:
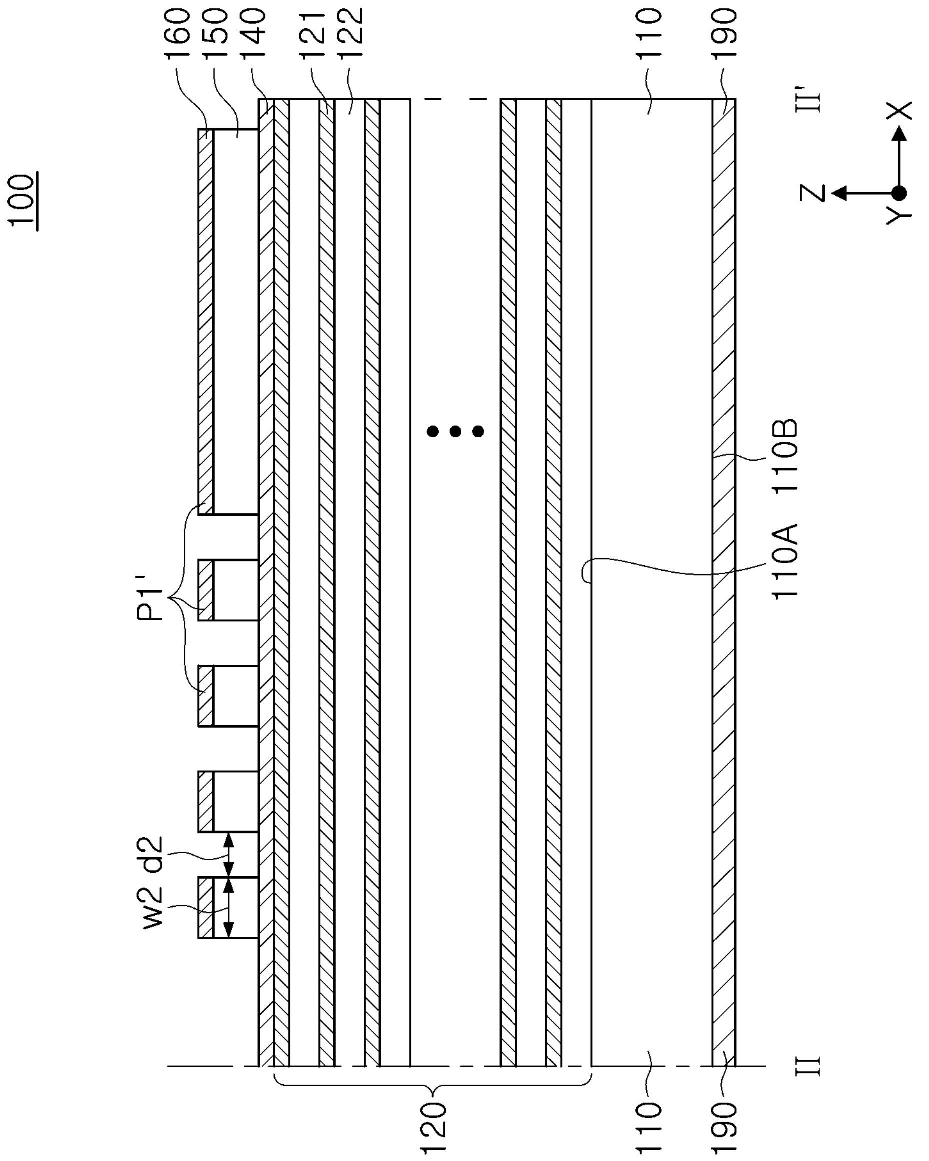

For example, referring to FIG. 5B, main pattern elements PA1' may be pattern elements arranged in a portion of the main pattern region PA1' in FIG. 4, and may be correction-target pattern elements outside of the allowable range according to deviations in critical dimensions. The main pattern elements PA1' to be corrected may have a width w2, greater than a width w1 of the main pattern elements PA1 illustrated in FIG. 5A, and may have an interval d2, smaller than an interval d1. The main pattern region PA1' in which the main pattern elements PA1' are located may be determined or identified as a correction-target region.

Although the method has been described in which the correction-target region is selected for each main pattern region with reference to the photomask illustrated in FIGS. 4 and 5B, it may be determined as distribution of critical dimensions for each region over the entire region of the photomask 100, and the correction-target region may be identified according to the distribution.

Figure 10:
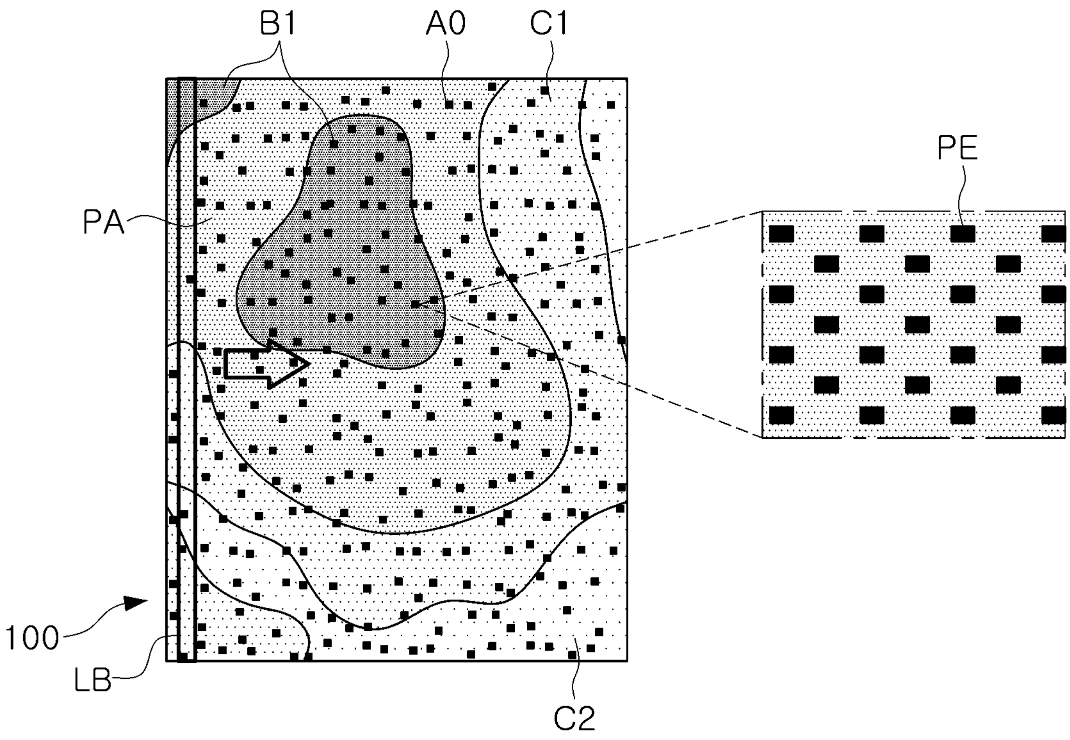
FIGS. 10 and 11 are plan views of a photomask illustrating various linear beam scanning methods, capable of being introduced to correct a photomask according to an embodiment.

FIG. 10 is a plan view schematically illustrating a gradient of a critical dimension of pattern elements of a photomask.

Referring to FIG. 10, an upper surface of a photomask in which a plurality of pattern regions are arranged is illustrated. In each of the pattern regions, a plurality of pattern elements may be arranged. In this case, A0, B1, C1, and C2 represent regions divided according to a critical dimension (e.g., an interval between adjacent patterns).

Pattern regions located at A0 may have pattern elements arranged at a target interval, and pattern regions located at B1 and C1 may have pattern elements having a deviation from the target interval, but the deviation may be within an allowable range (e.g., ±0.08). Pattern regions located at C2 may include patterns in which a deviation from the target interval is outside of the allowable range (e.g., −0.08). In this case, local CD correction may be required for the pattern regions located in the C2 region.

In this manner, an interval between pattern elements with respect to the photomask may be measured, and local CD correction information including position and CD deviations of the correction-target pattern elements with respect to a measurement-target photomask may be extracted. In a subsequent process (S50), a digital micromirror device (DMD) may be controlled based on the extracted local CD correction information.

Next, in S40, a chemical liquid CL may be applied to the photomask 100, and then, in S50, in a state in which the chemical liquid CL is applied, a laser beam LB may be irradiated to the correction-target region PA1'. As such, local heating using the laser beam according to the present embodiment may be performed under wet etching conditions. The laser beam irradiation may be performed in a state in which the supply of the chemical liquid is stopped. Local heating using a laser beam employed in an embodiment may be described with reference to FIG. 2. FIG. 2 is a process flow diagram illustrating photomask correction using local pattern heating employed in an embodiment, and FIG. 6 is a schematic diagram of a photomask correction device 500 according to an embodiment.

Figure 6:
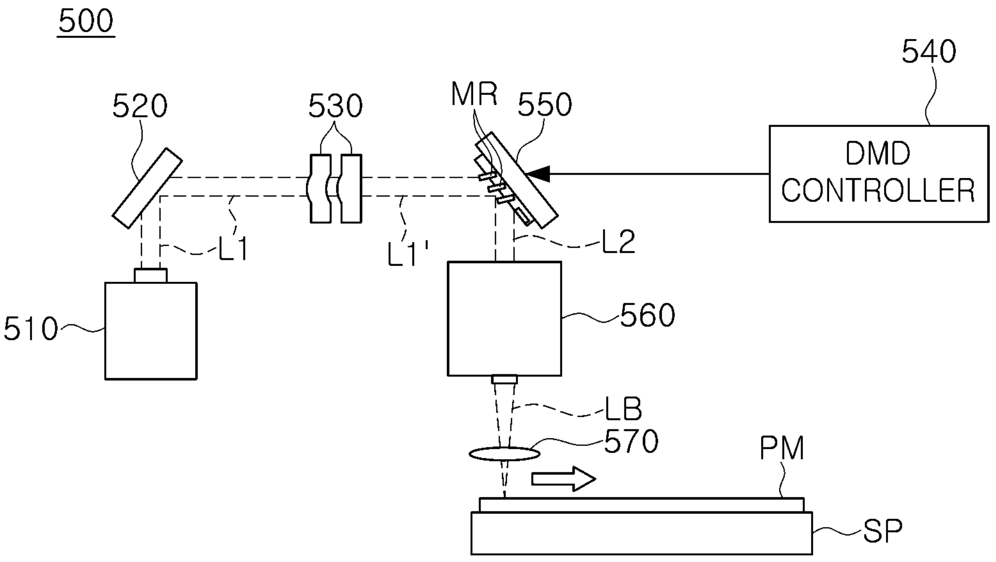
FIG. 6 is a schematic diagram of a photomask correction device according to an embodiment.

Referring to FIGS. 2 and 6, local heating using a laser beam may start with S52 of irradiating laser beams L1 and L1' to a digital micromirror device (DMD) 550.

Figure 7:
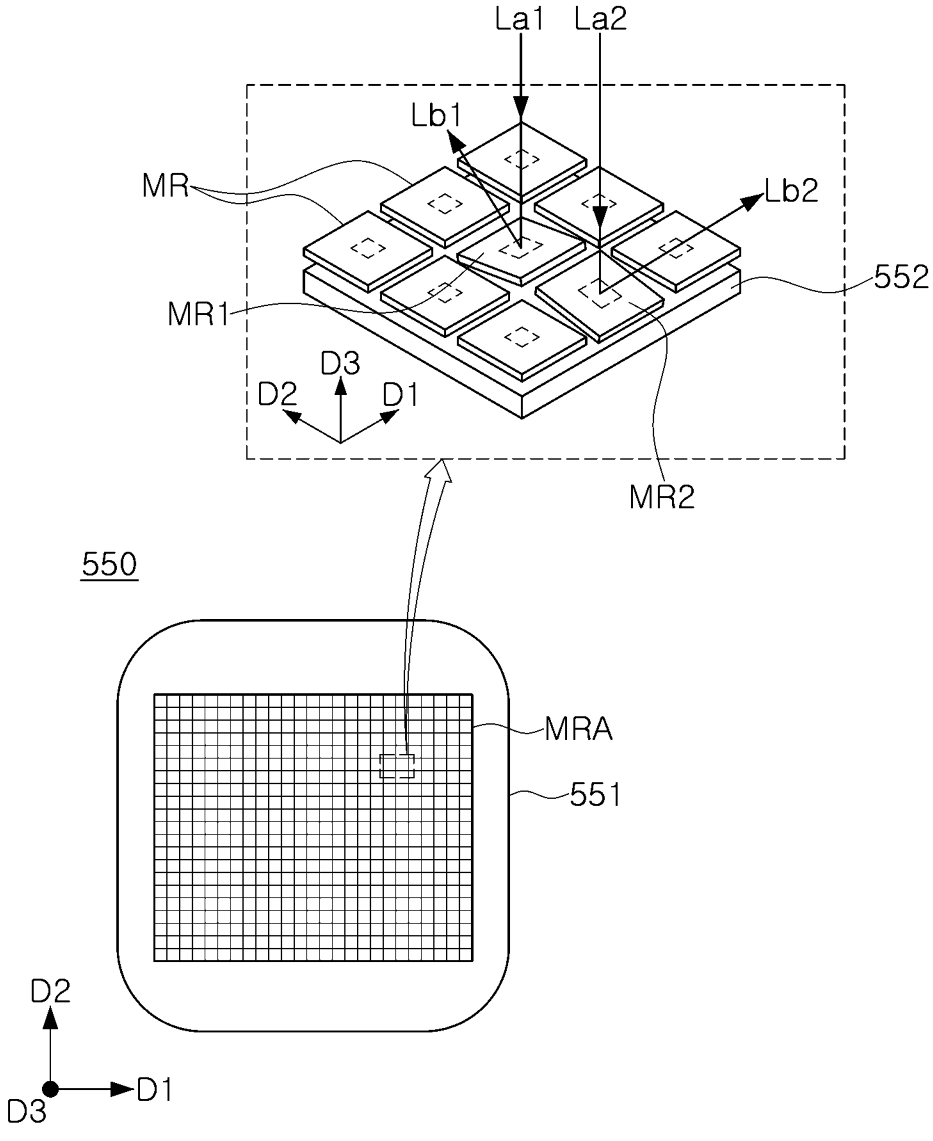
FIG. 7 is a schematic diagram illustrating a digital micromirror device employable in the photomask correction device illustrated in FIG. 6.

The DMD 550 employed in the present embodiment may include a mirror array MRA having mirrors arranged in a plurality of rows and a plurality of columns, and a body 551 surrounding the mirror array (see FIG. 7). The laser beam L1' may be irradiated to the mirror array MRA of the DMD 550.

To accurately irradiate the laser beam to the mirror array MRA, as illustrated in FIG. 6, the photomask correction device 500 may include a mirror unit 520 changing a path of the laser beam L1 irradiated from a laser light source 510 to face a beam shaper 530, and the beam shaper 530 for forming the beam L1' to have an area corresponding to the mirror array MRA of the DMD 550. For example, the beam shaper 530 may be a flat top laser beam shaper.

Then, in S54, based on the local CD correction information, previously extracted, the laser beam L1' may be converted into a beam pattern array (refer to "BPA" in FIG. 9A) corresponding to the mirror array MRA by controlling on/off switching of mirrors MR, respectively.

A mirror on/off control process of the DMD 550 may be described with reference to FIG. 7. FIG. 7 is a schematic diagram illustrating a DMD employable in the photomask correction device 500 of FIG. 6.

Referring to FIG. 7 together with FIG. 6, the DMD 550 employed in the present embodiment may include a circuit board 552 on which a CMOS circuit and the like is implemented, micro-electro mechanical system (MEMS) elements (not illustrated) disposed on the CMOS circuit board 552 and mechanically driving mirrors MR mounted on the MEMS elements, and the mirrors MR. For example, the MEMS elements may include a yoke element and a hinge element, respectively, for mechanical operation of a mirror.

A DMD controller 540 may be connected to the DMD 550 to individually change the on/off state of the mirrors MR. The on/off of the mirrors MR may be performed by tilting each of the mirrors MR in a predetermined direction using MEMS elements located below each of the mirrors MR.

In some embodiments, as illustrated in FIG. 7, a first mirror MR1 receiving an ON signal may be inclined in a +D2 direction, and a first beam La1 incident on the first mirror MR1 may be reflected as a first beam Lb1 in the +D2 direction by the inclined first mirror MR1. In the present embodiment, the reflected first beam Lb1 may be incident on a line beam shaper 530. A second mirror MR2 receiving an OFF signal may be inclined in a −D2 direction, and a second beam La2 incident on the second mirror MR2 may be reflected as a second beam Lb2 in the −D2 direction by the inclined second mirror MR2.

Figure 9A:
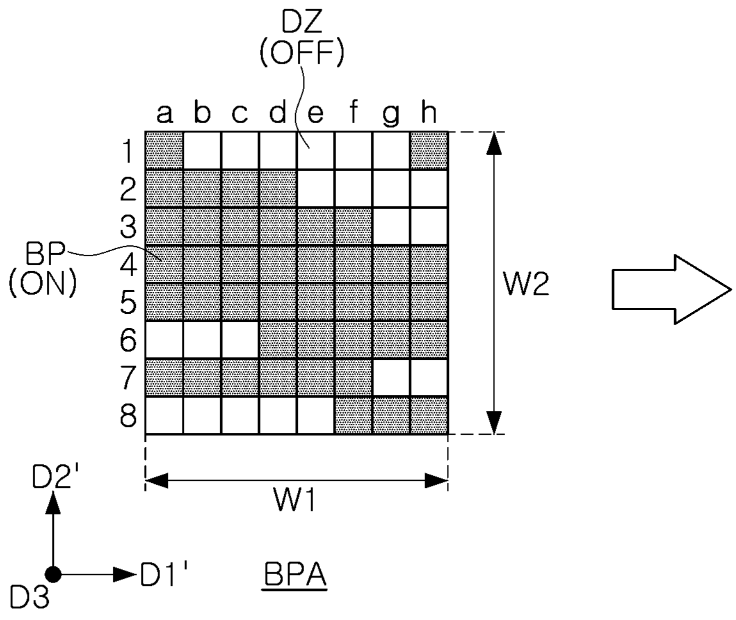
FIG. 9A illustrates an example of a beam pattern array obtained from DMD.

As described above, since a beam pattern BP is transmitted through the mirror MR1, on-switched, the beam pattern BP is not transmitted through the mirror MR2, off-switched, and a dark zone DZ is formed, a beam pattern array BPA corresponding to the mirror array MRA (an array having the plurality of rows and the plurality of columns) may be formed (refer to FIG. 9A). For example, since a pixel array corresponding to the mirror array MRA may be formed, and a beam pattern BP may be selectively formed according to on/off switching in each pixel, a desired beam pattern array BPA may be formed through DMD control. Such DMD control may be performed based on local CD correction information for a region to which a final beam LB of a photomask PM is irradiated.

In the present embodiment, mirrors may be set to be on/off in a manner to incline in opposite directions, but the present inventive concept is not limited thereto. In another embodiment, a beam pattern may be selectively formed by setting when a mirror is in an inclination state in one direction as an on-state and a default state (e.g., a non-inclination state) as an off-state.

Next, in S56, a linear beam LB may be formed by focusing the beam pattern array L2 through the optical system 560.

A process of forming the linear beam LB according to the present embodiment may be performed by focusing the beam pattern array ("BPA" in FIG. 9A) in a first direction (e.g., D1') in a direction D1 of the row. In the focusing process, an output per unit area may be increased.

In general, allowable laser output using the DMD 550 may be only several tens of W/cm$^2$ (e.g., 25 W/cm$^2$), whereas a high laser output of 100 W/cm$^2$ or more (preferably 120 W/cm$^2$ or more) for variation of CD of the correction-target pattern elements may be required. When the laser output is irradiated to the DMD 550, the mirrors MR of the DMD 550 may be destroyed. In the present embodiment, to increase the laser output of the final beam LB while maintaining the allowable laser output of the DMD 550, a method of focusing as the linear beam LB may be provided.

To sufficiently increase an output per unit area of the linear beam LB, the beam pattern array may be focused to increase 40 times or more than an output per unit area of the beam pattern. A width of the focused linear beam LB may be reduced by 40 times or more.

In some embodiments, a process of forming the linear beam LB according to the present embodiment may further include a process of extending in a second direction D2', perpendicular to the first direction D1'. An extended length of the linear beam LB in the second direction D2' may correspond to a width of the photomask in the second direction D2'. Such a linear beam may cover an entire area of the photomask in one scanning.

The linear beam LB formed in this case may have a plurality of regions corresponding to each row of the mirror array or the beam pattern array in the second direction D2'. In each of the plurality of regions, a laser output may be determined according to the number of mirrors in an on-state among mirrors arranged in a corresponding row, e.g., the number of beam patterns in the corresponding row. Since the largest number of beam patterns are formed when all mirrors of the corresponding row are opened, the corresponding region of the linear beam may have the highest laser output.

When the linear beam LB passes through the correction-target pattern regions, at least one region of the plurality of regions of the linear beam may be configured to have a laser output necessary for CD correction as described above. For example, the at least one region may have an output per unit area of 100 W/cm$^2$, preferably 120 W/cm$^2$ or more.

Subsequently, in S58, the linear beam LB may be irradiated to the photomask PM, in a state in which an etchant (not illustrated) is applied to the photomask PM.

In the present embodiment, by moving an irradiation position of the linear beam LB, CD correction may be performed on a desired region of the photomask PM. In some embodiments, CDs of locally located correction-target pattern elements may be corrected by irradiating the linear beam LB over an entire area of the photomask PM.

In a process of moving the irradiation position of the linear beam LB, the beam pattern array may be changed by controlling on/off switching of mirrors of the DMD according to local CD correction information of a region to be irradiated with the linear beam LB. As a result, laser output distribution in a longitudinal direction of the linear beam may be changed according to CD correction information of a region to be newly irradiated.

The process of moving the irradiation position of the linear beam may be performed using scanning or stepping. For example, such movement may be performed by scanning or stepping using an optical system, or may be performed by a wafer scanner or a wafer stepper.

As described above, in the local CD correction according to the present embodiment, the linear beam LB may be irradiated to the correction-target region PA1' in a state in which the chemical liquid CL is applied to the pattern elements of the photomask 100, and, a temperature of the chemical liquid may be locally increased in a region irradiated with the linear beam LB.

As a result, as illustrated in the following Arrhenius equation, an increase in temperature of a chemical liquid may increase an etching rate by a chemical reaction.

$$k = Ae^{\frac{-E}{RT}}$$

Where k is a reaction rate constant, A and E are intrinsic numerical constants according to the reactant, R is a gas constant, and T is an absolute temperature. According to the laser output distribution in the longitudinal direction of the linear beam LB and the change of the laser output distribution in the movement of the linear beam, local etching may be induced in the correction-target region PA1', and the CD of the correction-target region PA1' may be selectively corrected.

In the present embodiment, to increase precision of local etching by the laser beam, a wavelength of the laser beam may be selected not to be absorbed by the chemical liquid, but absorbed in the correction-target region in the photomask, to raise a temperature of the correction-target region. The laser beam employed in the present embodiment may have a wavelength that may not be absorbed by the etchant.

Figure 8:
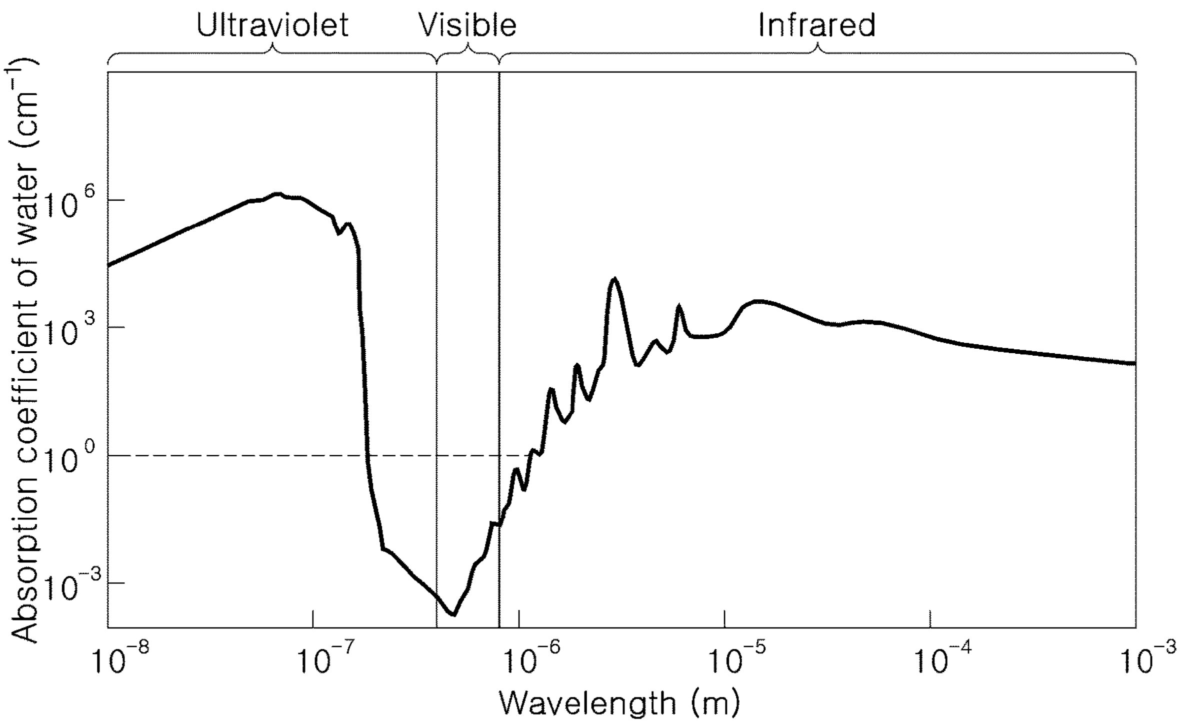
FIG. 8 is a graph illustrating an absorption rate of water according to wavelength of a laser beam.

Specifically, referring to FIG. 8, an absorption rate according to the wavelength of the laser beam is illustrated based on water, which occupies a significant portion of the chemical liquid. In consideration of a wavelength absorption rate of water, to maintain a absorption rate of the chemical liquid at a level of 10° (1/m) or less, a wavelength of the laser beam employed in the present embodiment may be about 200 nm to about 700 nm. In some embodiments, the wavelength of the laser beam may be about 400 nm to about 600 nm. For example, the laser beam may be a krypton fluoride (KrF) laser beam, a xenon chloride (XeCl) laser beam, an argon fluoride (ArF) laser beam, a krypton chloride (KrCl) laser beam, an argon (Ar) laser beam, a yttrium aluminum garnet (YAG) laser beam, or a carbon dioxide ($CO_2$) laser beam.

As described above, in a CD correction process according to the present embodiment, a laser beam, e.g., a linear beam LB, may be irradiated to the correction-target pattern region PA1' to perform local etching, to increase the interval d2 (FIG. 5B) (or decrease the width w2). Specifically, a deviation from a target interval of the correction-target pattern elements P1' located in the region C2 may be reduced, to be corrected to be located within the allowable range.

Since the photomask may include a plurality of correction-target regions locally located, a linear beam may be formed based on the local CD correction information (e.g., the position and CD deviations of the correction-target pattern element), and the laser output distribution in the longitudinal direction of the linear beam may be changed according to the local CD correction information of the correction-target region while moving the linear beam, to cover the entire region of the photomask, to efficiently perform CD correction of the correction-target region distributed over the entire region of the photomask.

Figure 9B:
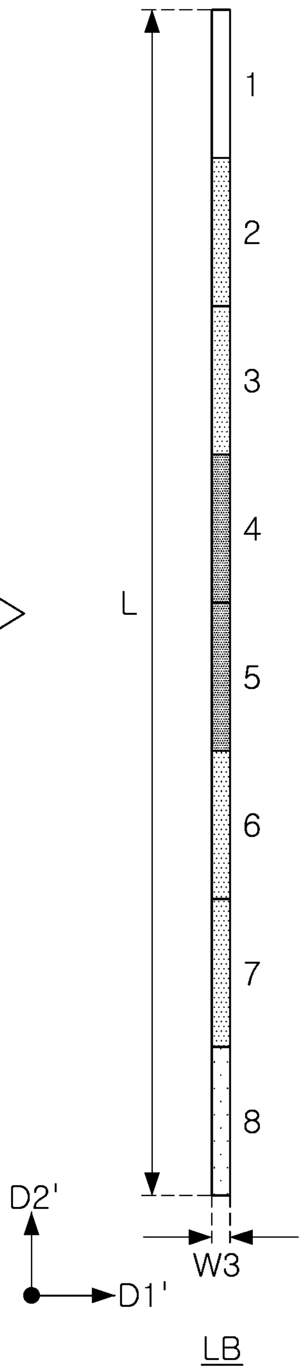
FIG. 9B illustrates an example of a linear beam in which the beam pattern array of FIG. 9A is converted by an optical system.

FIG. 9A illustrates an example of a beam pattern array obtained from DMD, and FIG. 9B illustrates an example of a linear beam in which the beam pattern array of FIG. 9A is converted by an optical system.

Referring to FIG. 9A, an example of a beam pattern array BPA obtained from a DMD during a photomask correction process according to an embodiment may be illustrated.

The beam pattern array BPA according to the present embodiment may have an 8×8 array, and it can be understood that this array corresponds to a mirror array of the DMD. In reality, the DMD may be composed of hundreds of thousands to millions of mirror arrays (e.g., 1920×1080), and the beam pattern array may also have a corresponding array, but for convenience of explanation, the beam pattern array is simplified to have an 8×8 array.

As described above, a laser beam irradiated to the mirror array MRA of the DMD may be converted into a beam pattern array BPA corresponding to the mirror array MRA by controlling the on/off switching of each of the mirrors MR of the DMD based on the local CD correction information.

Specifically, mirrors corresponding to pixels of (1,a) and (1,h) in a first row (1) may be switched in an on-state to form a beam pattern, and mirrors corresponding to pixels of (1,b), (1,c), (1,d), (1,e), (1,f), and (1,g) may be switched to form a dark zone.

In fourth to fifth rows, as a result of all mirrors being switched in an on-state, a beam pattern may be formed for all pixels in each row.

The beam pattern array BPA illustrated in FIG. 9A may be formed as the linear beam LB illustrated in FIG. 9B through an optical system ("560" in FIG. 6).

Referring to FIG. 9B, the linear beam LB may be focused on the beam pattern array BPA in a first direction (e.g., D1'), and may be a beam extended and obtained in a second direction D2'.

In this focusing process, the linear beam LB may be divided into a plurality of regions in the longitudinal direction D2', and each of the regions may be a component on which beam patterns BP of each of the rows of the beam pattern array BPA are focused. An output of each of the plurality of regions of the linear beam LB may be determined according to the number of mirrors in an on-state, among mirrors arranged in a corresponding row, e.g., the number of beam patterns BP in the corresponding row.

For example, fourth and fifth regions of the linear beam LB may correspond to fourth and fifth rows of the beam pattern array BPA, and all pixels in the fourth and fifth rows have a beam pattern BP, and may thus have a first output, which is the highest output, and correction-target pattern elements may be located in photomask regions corresponding to the fourth and fifth regions of the linear beam LB. A third region, a sixth region, and a seventh region of the linear beam LB may also have a second output, lower than the first output, but sufficient to cause a CD variation. In this case, the third region, the sixth region, and the seventh region of the linear beam LB may be beam components for correction pattern elements having a CD deviation, smaller than that of the fourth region and the fifth region.

Although a remaining region of the linear beam LB does not cause a CD variation, some beam patterns BP may exist. The existence of the beam pattern BP can be understood as a process of changing the beam pattern array BPA, to have laser output distribution of the linear beam LB that may be changed according to continuous movement of the linear beam LB.

In general, in a DMD, an allowable laser output may be only tens of W/cm$^2$ (e.g., 25 W/cm$^2$), whereas a high laser output of 100 W/cm$^2$ or more may be required for a CD variation of correction-target pattern elements. When such a laser output is irradiated to the DMD, mirrors of the DMD may be destroyed. In the present embodiment, a method of focusing as the linear beam LB may be provided to increase a laser output of a final beam while maintaining the allowable laser output of the DMD. For example, the first output of the fourth and fifth regions of the linear beam LB and the second output of the third, sixth and seventh regions may all have an output per unit area of 100 W/cm$^2$ or more, preferably 120 W/cm$^2$ or more.

As described above, when the linear beam LB passes through the correction-target pattern regions, at least one region among the plurality of regions of the linear beam LB may be configured to have a laser output necessary for CD correction as described above. For example, the at least one region may have an output per unit area of 100 W/cm$^2$ or more.

Also, in this focusing process, an output per unit area of the linear beam LB may be increased by 40 times or more than an output per unit area of the beam pattern BP, to sufficiently increase the output per unit area of the linear beam LB. A focused width W3 may be reduced by 40 times or more than the width W1 of the beam pattern array BPA.

In some embodiments, the process of forming the linear beam LB according to the present embodiment may further include a process (W1→W3) of extending in the second direction D2', perpendicular to the first direction D1'. A length L of the linear beam LB extended in the second direction D2' may correspond to a width of the photomask in the second direction D2' (refer to FIGS. 9A and 9B). The linear beam LB may complete CD correction by scanning the entire area of the photomask once in one direction.

When the length L of the linear beam LB is extended, the width W3 of the linear beam LB may become narrower to maintain the output per unit area. For example, a width of a mirror array of a typical DMD may range from 10 mm to 30 mm. When the length L of the linear beam LB may be extended to cover a wide region of the photomask, a width of the linear beam may be 10 μm to 50 μm.

Figure 11:
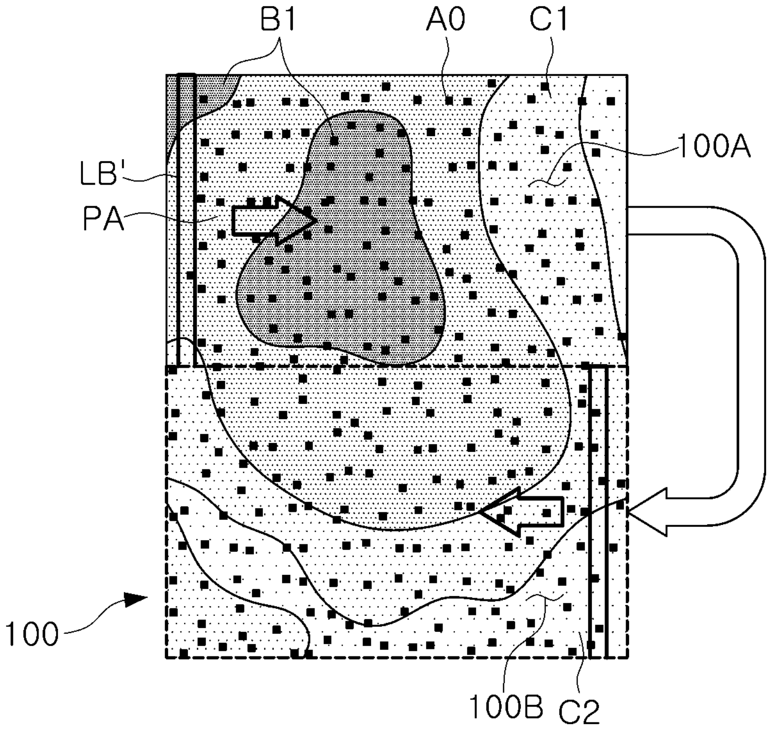

FIGS. 10 and 11 are plan views of a photomask illustrating various linear beam scanning methods, capable of being introduced to correct a photomask according to an embodiment.

Referring to FIG. 10, an upper surface of a photomask 100 in which a plurality of pattern regions A0, B1, C1, and C2 are arranged is illustrated. In each of the pattern regions, a plurality of pattern elements PE may be arranged. As described above, the regions A0, B1, C1, and C2 may be divided according to a critical dimension (e.g., an interval between adjacent patterns).

In the present embodiment, a linear beam LB may have a length corresponding to one width of the photomask 100, and CD correction for an entire area may be completed by scanning or stepping once in one direction (indicated by an arrow). In some embodiments, CD correction may be performed by repeatedly performing scanning or stepping two or more times, but even in this case, laser irradiation for the entire area may be efficiently performed.

Referring to FIG. 11, unlike the previous example, scanning or stepping may be performed by dividing an entire area of a photomask 100 into two regions 100A and 100B.

In the present embodiment, a linear beam LB' may have a length corresponding to half of one width of the photomask 100, and after scanning a first region 100A in a first direction (indicated by an upper arrow), the second CD correction may be completed by scanning a second region 100B in a second direction (indicated by a lower arrow), opposite to the first direction. In this manner, by dividing the photomask 100 into a plurality of regions and forming the linear beam LB' corresponding to a width of the divided regions, CD correction of the desired photomask 100 may be efficiently performed.

Figure 12:
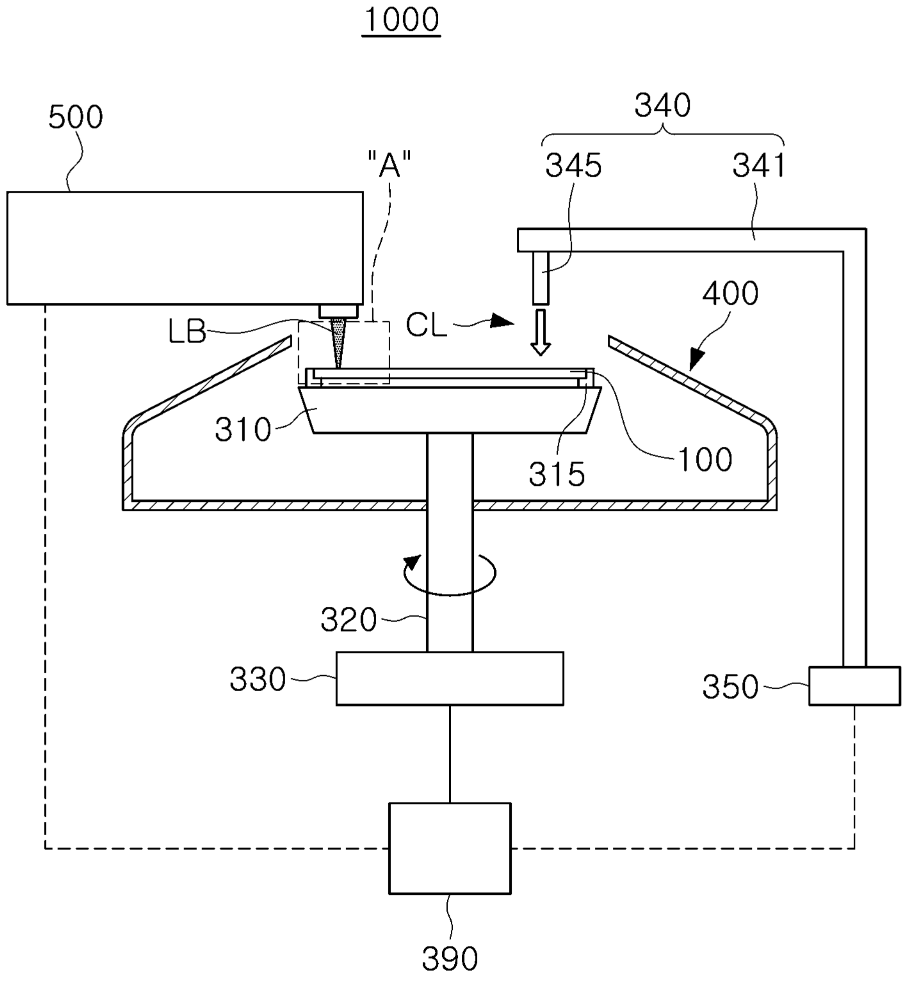
FIG. 12 is a cross-sectional view schematically illustrating a photomask correction system according to an embodiment.
Figure 13:
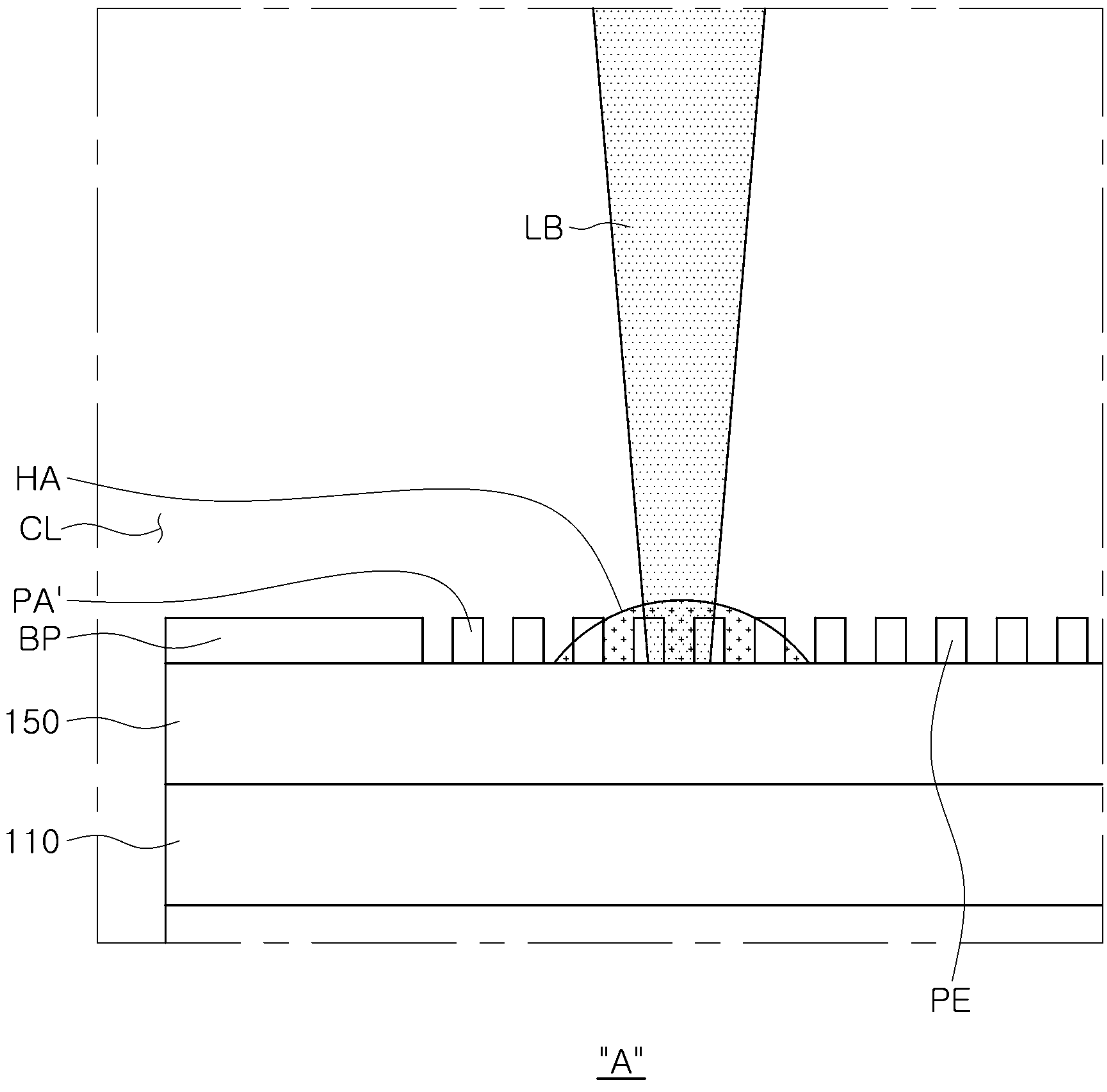
FIG. 13 is an enlarged cross-sectional view illustrating a portion of the photomask correction system of FIG. 12.

FIG. 12 is a cross-sectional view schematically illustrating a photomask correction system according to an embodiment, and FIG. 13 is an enlarged cross-sectional view illustrating a portion "A" of the photomask correction system of FIG. 12.

Referring to FIG. 12, a photomask correction system 1000 according to the present embodiment may include a support portion 310 supporting the photomask 100, a chemical supply unit 340 supplying a chemical liquid CL to an upper surface of the photomask 100, a CD correction device 500 irradiating a linear beam LB to a partial region of the upper surface of the photomask 100, and a controller 390 controlling the chemical supply unit 340 and the CD correction device 500.

As illustrated in FIGS. 5A and 5B, a plurality of pattern elements PE may be arranged on the upper surface of the photomask 100, and the chemical supply unit 340 and the CD correction device 500 may be configured to face the upper surface of the photomask 100. Specifically, the chemical supply unit 340 may be configured to spray the chemical liquid on the upper surface of the photomask 100, and the CD correction device 500 may be configured to irradiate the laser beam LB to the upper surface (particularly, a correction-target region) of the photomask 100.

The controller 390 may be connected to the chemical supply unit 340 and the CD correction device 500, and may be configured to control injection of the chemical liquid CL of the chemical supply unit 340 and irradiation of the linear beam LB of the CD correction device 500.

The controller 390 may determine a region in which correction-target pattern elements having a critical dimension, different from a target critical dimension, among the plurality of pattern elements PE, are arranged as a correction-target region PA', and in a state in which supply of the chemical liquid CL is completed, may drive the CD correction device 500 to irradiate and move the linear beam LB to the correction-target region PA' in a manner such as scanning (see FIG. 6). In addition, the controller 390 may be configured to stop the supply of the chemical liquid CL of the chemical supply unit 340 and irradiate the linear beam LB to the correction-target region PA'.

The chemical supply unit 340 may include a chemical supply line 341 and a chemical nozzle 345. Chemicals stored in a chemical supply source (not illustrated) may be supplied to the chemical nozzle 345 through the chemical supply line 341. The chemical supply unit 340 may include a valve (not illustrated) for opening and closing the chemical supply line 341 in one region of the chemical supply line 341.

The CD correction device 500 can be understood with reference to FIG. 6.

Specifically, a laser beam may be irradiated to a mirror array of a DMD, and on/off switching of each mirror may be then controlled based on local CD correction information obtained in advance (e.g., by a DMD controller), to convert the laser beam into a beam pattern array corresponding to the mirror array. A linear beam may be formed to increase an output by focusing the beam pattern array through an optical system, and in a state in which an etchant is applied to the photomask, CD correction may be performed over a desired area of the photomask by scanning the linear beam on the photomask.

In addition, the photomask correction system 1000 according to the present embodiment may include a support portion 310 supporting the photomask 100, and a container 400 providing an internal space in which cleaning and correction (etching) of the photomask 100 are performed.

The container 400 may prevent a chemical liquid used in the cleaning and etching process and materials generated during the process from leaking externally. The support portion 310 may be disposed in the internal space of the container 400 to support the photomask 100 during processing. The support portion 310 may include a guide structure 315 supporting the photomask 100.

The photomask correction system 1000 according to the present embodiment may include a support shaft 320 configured to rotate the support portion 310, and a support driver 330 to rotate the support shaft 320. The support driver 330 may be controlled by the controller 390. The support driver 330 may include a lifting function to move in the vertical direction, to adjust a relative height of the support portion 310 with respect to the container 400. The photomask 100 may be loaded on the support portion 310 or unloaded from the support portion 310 using the lifting function. In some embodiments, instead of elevating the support portion 310, the container 400 may be configured to move vertically.

A photomask correction process according to the present embodiment may be performed together with a photomask cleaning process in parallel.

The chemical liquid CL employed in the present embodiment may be configured to perform a cleaning action at a first temperature, and to etch (correct) correction-target pattern elements at a second temperature raised by the laser beam LB. In a region HA raised to the second temperature by the linear beam LB, the CD deviation may be locally corrected in the correction-target region PA' to which the laser beam LB is irradiated. For example, the chemical liquid CL may include at least one of aqueous ammonia ($NH_4OH$) or tetramethylammonium hydroxide (TMAH). For example, the chemical liquid may include a mixture of ammonium hydroxide ($NH_3OH$), hydrogen peroxide ($H_2O_2$), and ultrapure water ($H_2O$), a mixture of ammonia ($NH_3$) and deionized water, ultrapure water to which carbon dioxide is added, or the like.

Figure 14:
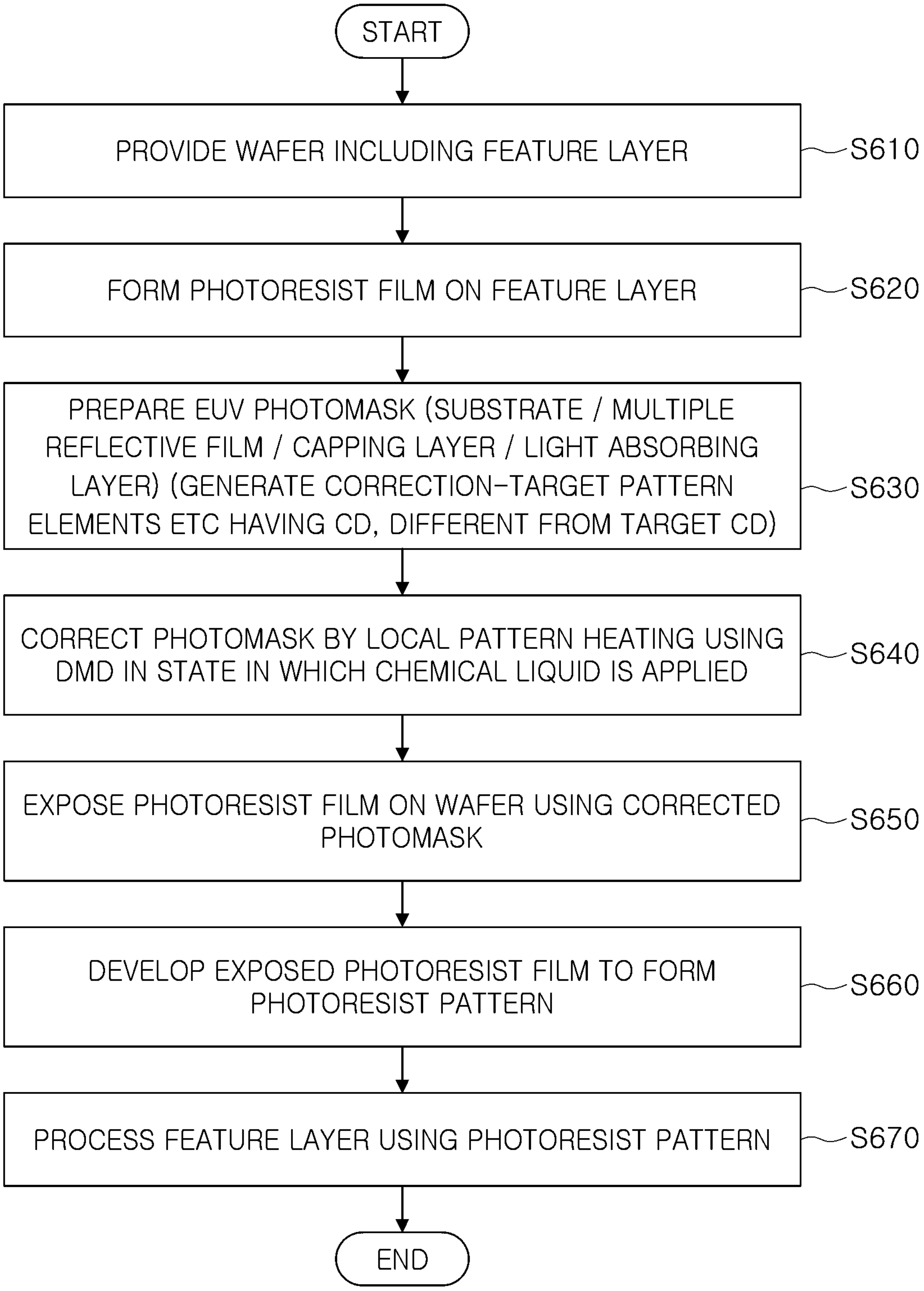
FIG. 14 is a process flow diagram illustrating a method of manufacturing a semiconductor device according to an embodiment.

FIG. 14 is a process flow diagram illustrating a method of manufacturing a semiconductor device according to an embodiment.

In S610, a wafer including a feature layer may be provided. In some embodiments, the feature layer may be a conductive layer or an insulating layer, formed on the wafer. For example, the feature layer may be formed of a metal, a semiconductor, or an insulating material. In some embodiments, the feature layer may be a portion of the wafer.

Next, in S620, a photoresist film may be formed on the feature layer.

In some embodiments, the photoresist film may be formed of an extreme ultraviolet (EUV) (135 nm) resist material. In some other embodiments, the photoresist film may be formed as a resist for a fluorine ($F_2$) excimer laser (157 nm), a resist for an ArF excimer laser (193 nm), or a resist for a KrF excimer laser (248 nm). The photoresist film may be formed as a positive type photoresist or a negative type photoresist.

In some embodiments, to form a photoresist film formed of the positive type photoresist, a photoresist composition including a photosensitive polymer having an acid-labile group, a potential acid, and a solvent may be spin coated over the feature layer.

In some embodiments, the photosensitive polymer may include a (meth)acrylate-based polymer. The (meth)acrylate-based polymer may be an aliphatic (meth)acrylate-based polymer. For example, the photosensitive polymer may be polymethylmethacrylate (PMMA), poly(t-butylmethacrylate), poly(methacrylic acid)), poly(norbornylmethacrylate)), a binary or tertiary polymer of repeating units of the (meth)acrylate-based polymers, or a mixture thereof.

In addition, the photosensitive polymers described above may be substituted with various protecting groups that may be acid-labile. The protecting groups may be formed of t-butoxycarbonyl (t-BOC), tetrahydropyranyl, trimethylsilyl, phenoxyethyl, cyclohexenyl, t-butoxycarbonylmethyl, tert-butyl, adamantyl, or norbornyl group. However, the present inventive concept is not limited to the above.

In some embodiments, the potential acid may be formed of a photoacid generator (PAG), a thermoacid generator (TAG), or a combination thereof. In some embodiments, the PAG may be formed of a material that generates an acid upon exposure to any one light selected from EUV light (1-31 nm), an $F_2$ excimer laser (157 nm), an ArF excimer laser (193 nm), and a KrF excimer laser (248 nm). The PAG may be formed of onium salts, halogen compounds, nitrobenzyl esters, alkylsulfonates, diazonaphthoquinones, iminosulfonates, disulfones, diazomethanes, sulfonyloxyketones, or the like.

Next, in S630, an EUV photomask may be prepared. In a similar manner to the above-described embodiment, the EUV photomask may include a plurality of pattern elements including a substrate, a reflective layer reflecting EUV light on the substrate, and a light absorber.

The pattern elements having a critical dimension, different from a target critical dimension, may include correction-target pattern elements out of an allowable range according to a deviation of the critical dimension. These correction-target pattern elements may be locally distributed over an entire region of the photomask. For example, the correction-target pattern elements may have a pattern width, smaller than a target pattern width of the plurality of pattern elements. Alternatively, the correction-target pattern elements may be arranged at an interval, greater than a target interval of the plurality of pattern elements. A region in which the correction-target pattern elements are located may be determined as a correction-target region. In this case, local CD correction information including positions and CD deviations of the correction-target pattern elements may be extracted. Such information may be used to control mirrors of a DMD to change output distribution of a linear beam according to a region to be irradiated.

Next, in S640, the photomask may be corrected by using a DMD in a state in which a chemical liquid is applied to the photomask by local pattern heating.

As described above, a laser beam may be irradiated to a mirror array of the DMD, and on/off switching of each mirror may be then controlled based on the local CD correction information acquired in advance (e.g., by a DMD controller), to convert the laser beam into a beam pattern array corresponding to the mirror array. Next, a linear beam having an output sufficient for CD correction may be formed by focusing the beam pattern array through an optical system, and in a state in which an etchant is applied to the photomask, CD correction may be performed over a desired area of the photomask by scanning (or stepping) the linear beam on the photomask.

Next, in S650, the photoresist film may be exposed in the photolithography system using the photomask corrected according to S640.

In some embodiments, in an exposure process, the photoresist film may be exposed with EUV light reflected from the photomask corrected in S640. In the exposure process, the photoresist film may be exposed using EUV light reflected from multi-reflective layers of the corrected photomask, for example, the reflective layer 120 of the photomask 100 illustrated in FIG. 5A.

Next, in S660, the exposed photoresist film may be developed to form a photoresist pattern, and then, in S670, the feature layer may be processed using the photoresist pattern. In some embodiments, to process the feature layer in S670, the feature layer may be etched using the photoresist pattern as an etch mask, to form a fine feature pattern.

In some other embodiments, to process the feature layer in S670, impurity ions may be implanted into the feature layer using the photoresist pattern as an ion implantation mask. In addition, in some other embodiments, to process the feature layer according to S670, a separate process film may be formed on the feature layer exposed through the photoresist pattern formed in S660. The process film may be formed of a conductive film, an insulating film, a semiconductor film, or a combination thereof.

A critical dimension (CD) of a correction-target light absorber pattern may be effectively corrected by continuously irradiating (scanning or stepping) over a desired area (a total area) of an EUV photomask using a linear beam with high power formed using a digital micromirror device (DMD) and an optical system under an environment of a chemical liquid.

Various advantages and effects of the present inventive concept are not limited to the above, and will be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A method of manufacturing a photomask, the method comprising:

forming a photomask comprising a plurality of pattern elements, wherein the plurality of pattern elements comprise correction-target pattern elements having a critical dimension (CD) deviation from a target CD;

acquiring local CD correction information including position and the CD deviation of the correction-target pattern elements in the photomask;

directing a laser beam to a mirror array of a digital micromirror device (DMD), wherein the mirror array has mirrors arranged in a plurality of rows and a plurality of columns;

converting the laser beam into a beam pattern array corresponding to the mirror array by controlling on/off switching of each of the mirrors based on the local CD correction information, wherein the beam pattern array has a beam pattern arranged in a position corresponding to on-state mirrors in the mirror array;

forming a linear beam by focusing the beam pattern array through an optical system; and performing CD correction of an area of the photomask, the CD correction comprising applying an etchant to the photomask, directing the linear beam to the photomask, and moving the linear beam to irradiate the area.

2. The method of claim 1, further comprising changing the beam pattern array by controlling on/off switching of the mirrors in the mirror array according to local CD correction information for the area during movement of the linear beam.

3. The method of claim 2, wherein, during the movement of the linear beam, laser output distribution in a longitudinal direction of the linear beam is changed according to local CD correction information for the area.

4. The method of claim 1, wherein movement of the linear beam is a scanning movement or a stepping movement.

5. The method of claim 1, wherein the forming the linear beam comprises focusing the beam pattern array so that an output per unit area of the linear beam increases by forty (40) times or more than an output per unit area of the beam pattern.

6. The method of claim 1, wherein the forming the linear beam comprises focusing the beam pattern array in a first direction corresponding to a direction of the plurality of rows, and extending the beam pattern array in a second direction, perpendicular to the first direction.

7. The method of claim 6, wherein the linear beam comprises a plurality of regions, each region corresponding to a respective one of the plurality of rows of the mirror array in the second direction, wherein a laser output of each region is proportional to a number of on-state mirrors in the respective one of the plurality of rows.

8. The method of claim 6, wherein at least one region of the linear beam has an output per unit area of 120 $W/cm^2$ or more.

9. The method of claim 6, wherein a length of the linear beam in the second direction corresponds to a width of the photomask in the second direction, and the area of the photomask is a total area of the photomask.

10. The method of claim 6, wherein a width of the linear beam in the first direction is about 10 μm to 50 μm.

11. The method of claim 1, wherein the forming the photomask comprises:

preparing a mask blank comprising a substrate, a reflective layer on the substrate, and a light absorbing layer on the reflective layer, wherein the reflective layer is configured to reflect extreme ultraviolet (EUV) light, and etching the light absorbing layer to form the plurality of pattern elements.

12. The method of claim 1, wherein the etchant is configured not to absorb a wavelength of the laser beam.

13. The method of claim 12, wherein the laser beam has a wavelength of about 200 nm to 700 nm.

14. The method of claim 1, wherein the etchant comprises at least one of aqueous ammonia ($NH_4OH$) or tetramethylammonium hydroxide (TMAH).

15. A method of manufacturing a photomask, the method comprising:

preparing a mask blank comprising a substrate, a reflective layer on the substrate, and a light absorbing layer on the reflective layer, wherein the reflective layer is configured to reflect extreme ultraviolet (EUV) light;

etching the light absorbing layer to form a photomask comprising a plurality of pattern elements, wherein the plurality of pattern elements include correction-target pattern elements having a critical dimension (CD) deviation from a target CD;

identifying a correction-target region in which the correction-target pattern elements are located in the photomask, and acquiring local CD correction information including position and CD deviations of the correction-target pattern elements;

directing a laser beam to a mirror array of a digital micromirror device (DMD), wherein the mirror array comprises mirrors arranged in a plurality of rows and a plurality of columns;

converting the laser beam into a beam pattern array corresponding to the mirror array by controlling on/off switching of each of the mirrors based on the local CD correction information, wherein the beam pattern array has a beam pattern arranged in a position corresponding to on-state mirrors in the mirror array;

forming a linear beam by focusing the beam pattern array through an optical system; and performing CD correction of the photomask by applying a chemical liquid to the photomask and scanning the linear beam over the photomask to irradiate the photomask.

16. The method of claim 15, wherein the chemical liquid is applied to the photomask at a first temperature, and wherein the laser beam heats the chemical liquid to a second temperature such that the chemical liquid etches the correction-target pattern elements.

17. The method of claim 15, wherein at least one region, among a plurality of regions of the linear beam, has an output per unit area of 120 $W/cm^2$ or more.

18. The method of claim 15, wherein forming the linear beam comprises focusing the beam pattern array in a first direction corresponding to a direction of the plurality of rows, and extending the beam pattern array in a second direction, perpendicular to the first direction, and the linear beam has laser output distribution that changes in the second direction.

19. The method of claim 18, wherein a width of the linear beam in the first direction is about 10 μm to 50 μm, and a length of the linear beam in the second direction corresponds to a width of the photomask in the second direction.

20. A method of manufacturing a semiconductor device, comprising:

forming a photoresist film on a wafer comprising a feature layer;

preparing a photomask comprising a substrate, a reflective layer on the substrate, and a light absorbing layer on the reflective layer, wherein the reflective layer is configured to reflect extreme ultraviolet (EUV) light, and wherein the light absorbing layer comprises a plurality of pattern elements, wherein the plurality of pattern elements include correction-target pattern elements having a critical dimension (CD) deviation from a target CD;

correcting critical dimensions of the correction-target pattern elements by applying a chemical liquid to the photomask and irradiating a region in which the correction-target pattern elements are located with a laser beam resulting in a corrected photomask;

forming a photoresist pattern by exposing and developing the photoresist film using the corrected photomask; and processing the feature layer using the photoresist pattern, wherein the correcting of the critical dimensions of the correction-target pattern elements comprises:

acquiring local CD correction information including position and CD deviations of the correction-target pattern elements in the photomask;

directing a laser beam to a mirror array of a digital micromirror device (DMD), wherein the mirror array has mirrors arranged in a plurality of rows and a plurality of columns;

converting the laser beam into a beam pattern array corresponding to the mirror array by controlling on/off switching of each of the mirrors in the mirror array based on the local CD correction information;

forming a linear beam by focusing the beam pattern array through an optical system; and performing CD correction over a desired area of the photomask by applying an etchant to the photomask and scanning the linear beam over the photomask to irradiate the photomask.

* * * * *